United States Patent
Tseng et al.

(10) Patent No.: US 12,146,483 B2
(45) Date of Patent: Nov. 19, 2024

(54) SYSTEM FOR SUPPLYING CHEMICAL SOLUTION

(71) Applicant: TAIWAN SEMICONDUCTOR MANUFACTURING COMPANY LTD., Hsinchu (TW)

(72) Inventors: Chih-Chiang Tseng, Hsinchu County (TW); Ming-Lee Lee, Kaohsiung (TW); Chiang Jen Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/338,354

(22) Filed: Jun. 21, 2023

(65) Prior Publication Data

US 2023/0335416 A1 Oct. 19, 2023

Related U.S. Application Data

(62) Division of application No. 16/932,649, filed on Jul. 17, 2020, now Pat. No. 11,721,561.

(51) Int. Cl.
*F04B 49/00* (2006.01)
*G01R 29/12* (2006.01)
*H01L 21/67* (2006.01)

(52) U.S. Cl.
CPC ............. *F04B 49/00* (2013.01); *G01R 29/12* (2013.01); *H01L 21/67017* (2013.01); *F04B 2203/00* (2013.01)

(58) Field of Classification Search
CPC .. F04B 49/06; F04B 49/10; F04B 2201/1201; F04B 2203/0202; F04B 2203/0209;
(Continued)

(56) References Cited

U.S. PATENT DOCUMENTS 6,764,212 B1 7/2004 Nitta et al.
2018/0334318 A1* 11/2018 Cho ..................... C09D 5/24
(Continued)

FOREIGN PATENT DOCUMENTS

CN 105060234 A 11/2015
CN 105526135 A 4/2016
(Continued)

OTHER PUBLICATIONS

English Abstract Translation of CN111271840A.
(Continued)

*Primary Examiner* — Bryan M Lettman
(74) *Attorney, Agent, or Firm* — WPAT LAW; Anthony King

(57) ABSTRACT

A system includes a chemical storage tank, a pipeline, a pump, a first electrostatic probe, and a control unit. The pipeline is connected to the chemical storage tank. The pump is connected to the pipeline and configured to pump a chemical solution from the chemical storage tank into the pipeline. The first electrostatic probe is coupled to the pump and configured to measure an electrostatic voltage of the pump. The control unit is coupled to the first electrostatic probe and configured to obtain a measurement of an electrostatic voltage from the first electrostatic probe.

19 Claims, 7 Drawing Sheets

(58) Field of Classification Search
CPC ...... F04B 49/00; F04B 2203/00; F04B 49/20; F04B 15/04; F04B 45/02; F04D 27/004; F04D 15/0077; F04D 15/0066; H01L 21/67017; G01R 29/12; B01J 4/008; B01J 2204/002; B01J 2219/00162; B01J 2219/00191; B01J 2219/00193; B01J 2219/00209; B01J 2219/00211–2219/00247; Y10T 137/86027; G05D 7/00; G01N 27/60; G01N 29/2406
USPC ..................................................... 216/83, 99
See application file for complete search history.

(56) References Cited

U.S. PATENT DOCUMENTS

| | | | |
|---|---|---|---|
| 2020/0039660 A1* | 2/2020 | Mills | B67D 7/3236 |
| 2021/0123963 A1* | 4/2021 | Wu | G01R 29/12 |
| 2022/0056918 A1* | 2/2022 | Momeni | F04D 13/086 |

FOREIGN PATENT DOCUMENTS

| | | | |
|---|---|---|---|
| CN | 106771317 | A | 5/2017 |
| CN | 108097486 | A | 6/2018 |
| CN | 209513921 | U | 10/2019 |
| CN | 209539663 | U | 10/2019 |
| CN | 111271840 | A | 6/2020 |
| JP | S5482022 | A | 6/1979 |
| JP | S5482023 | A | 6/1979 |
| JP | H03150474 | A | 6/1991 |
| TW | 238812 | U | 1/1995 |

OTHER PUBLICATIONS

English Abstract Translation of CN105526135A.
English Abstract Translation of CN108097486A.
English Abstract Translation of CN106771317A.
English Abstract Translation of CN209513921U.
English Abstract Translation of CN209539663U.
English Abstract Translation of CN105060234A.
English Abstract Translation of JPH 03150474A.
English Abstract Translation of JPS5482022A.
English Abstract Translation of JPS5482023A.
Notice of Allowance, Cited References and Search Report dated Dec. 25, 2023 issued by CNIPA of China for the China Counterpart Application No. 202110259551X.

* cited by examiner

SYSTEM FOR SUPPLYING CHEMICAL SOLUTION

PRIORITY CLAIM AND CROSS-REFERENCE

This patent is a divisional application of U.S. patent application Ser. No. 16/932,649, filed on Jul. 17, 2020, entitled of "SYSTEM AND METHOD FOR SUPPLYING CHEMICAL SOLUTION", which is incorporated by reference in its entirety.

BACKGROUND

In a semiconductor fabrication facility, static electricity leading to electrostatic discharge (ESD) frequently develops on surfaces of articles made of insulating materials when the articles are touched or rubbed by other insulating materials. The buildup of static electricity is often generated by a phenomenon known as a tribocharging theory. The discharge of the static electricity to machines and to human operators can cause damage to semiconductor wafers and process tools, or cause injury to a machine operator. In a semiconductor fabrication facility, it is therefore necessary to control ESD by grounding the machines, by controlling the relative humidity, or by building walls and floor coverings with slightly conductive materials such that electrical charges can be routed to ground. When the triboelectricity is suitably controlled, the control of dust and particulate contamination is also enhanced.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
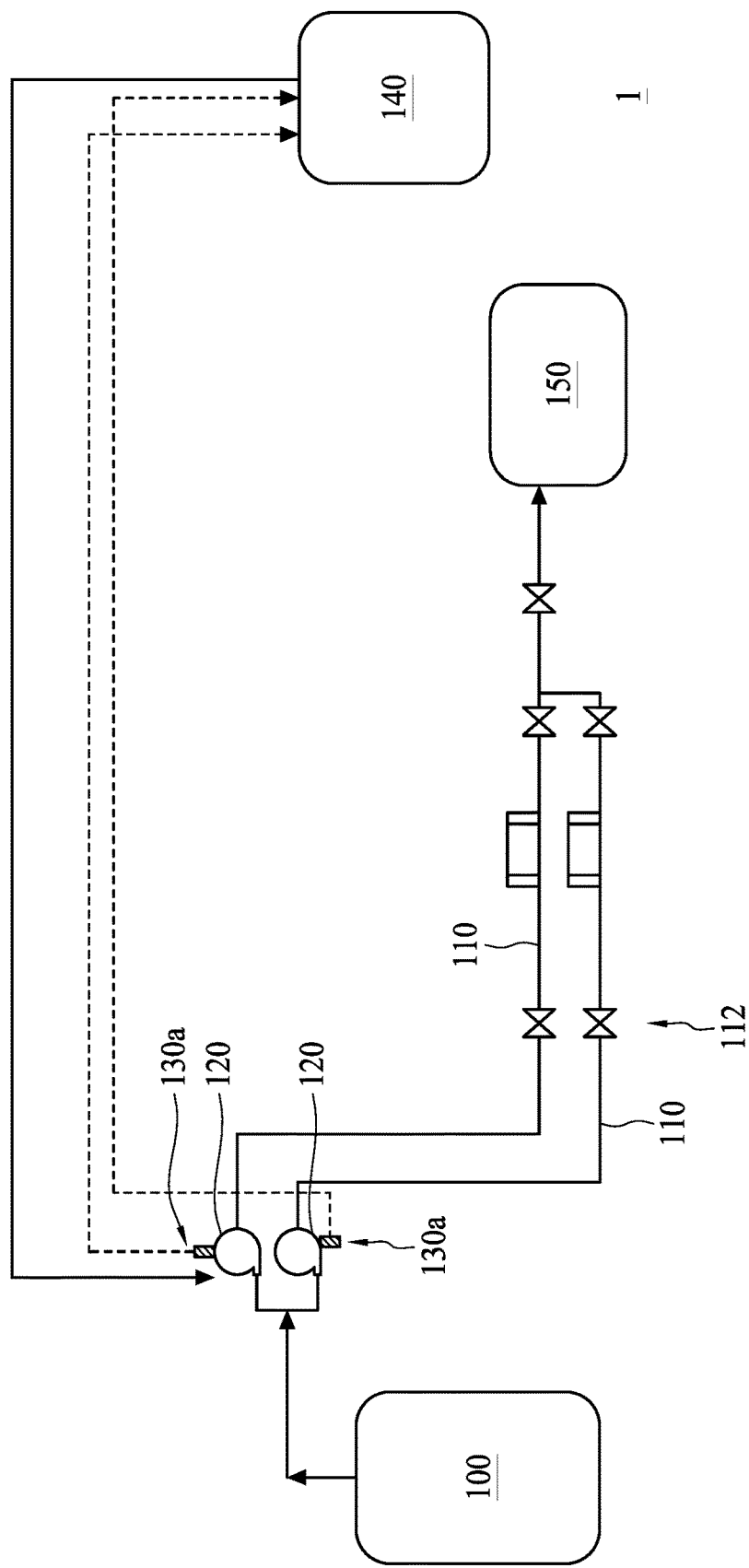
FIG. 1 is a schematic drawing of a system for supplying a chemical solution according to aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Semiconductor processes, such as photolithography, wet etching and cleaning, have become more sensitive at advanced process nodes. The liquids, solvents or solutions used in the photolithography, wet etching or cleaning may extract metal particles. The extracted metals from the chemical delivery systems may cause critical wafer defects that adversely impact process yields. In some comparative approaches, to counter this adverse yield impact, manufacturers have replaced metal pipelines with insulating pipelines such as plastic pipelines. This change results in reduced extracted metals in the process chemicals.

However, another concern with electrostatic discharge (ESD) is raised with the comparative approaches when a low-conductivity or high-resistance chemical solution is transported or delivered. When such chemical solution is transported, it can easily cause charge separation and accumulation at wall boundaries of pumps and pipelines. The overall mechanism of charge separation and accumulation in the pumps and pipelines generates static electricity. Further, the static electricity generated during the transportation may damage the pipelines and the pumps, and create leak paths. In some comparative approaches, instead of metal particles, insulating particles may be generated in the plastic pipelines, causing particle contamination of wafers. In other comparative approaches, when the chemical solution is flammable, the electrostatic discharge may further cause an ignition or explosion, which could cause extensive damage in a semiconductor fabrication facility.

The present disclosure therefore provides a system and a method for supplying a chemical solution. The system and the method for supplying the chemical solution are used to measure, monitor and control static electricity. In some embodiments, the system includes electrostatic probes coupled to or adopted on pumps and pipelines to perform on line measurement and monitoring. In some embodiments, the electrostatic probes adopted on the pumps and the pipelines provide continuous static electricity measurement, which can mitigate external environmental effects or human error. In some embodiments, the method further adjusts or tunes parameters of the system for supplying the chemical solution to reduce static electricity generation according to the measurement obtained from the electrostatic probes. Accordingly, the adjustment can be performed promptly and thus particle contamination can be mitigated.

Figure 2:
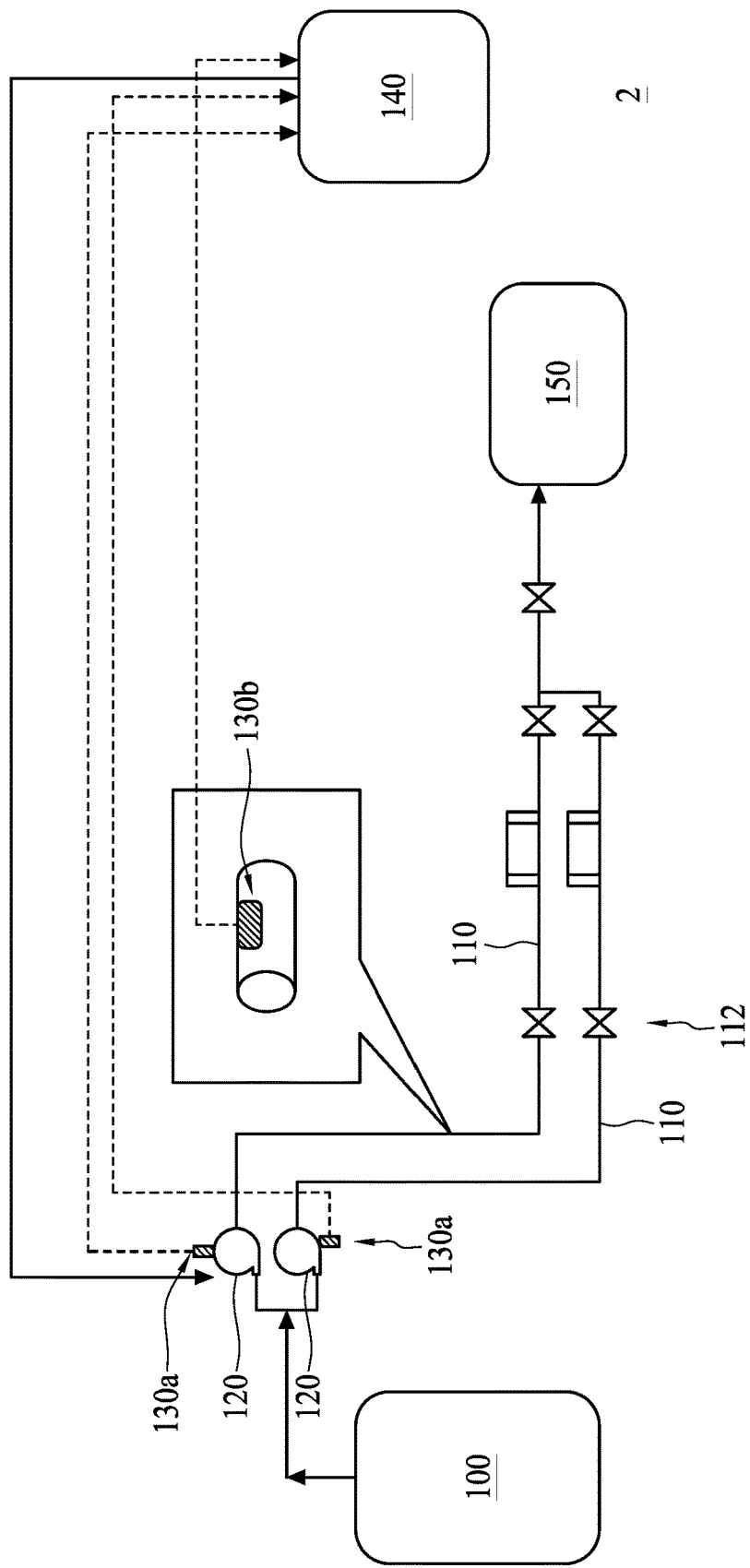
FIG. 2 is a schematic drawing of a system for supplying a chemical solution according to aspects of one or more embodiments of the present disclosure.
Figure 3:
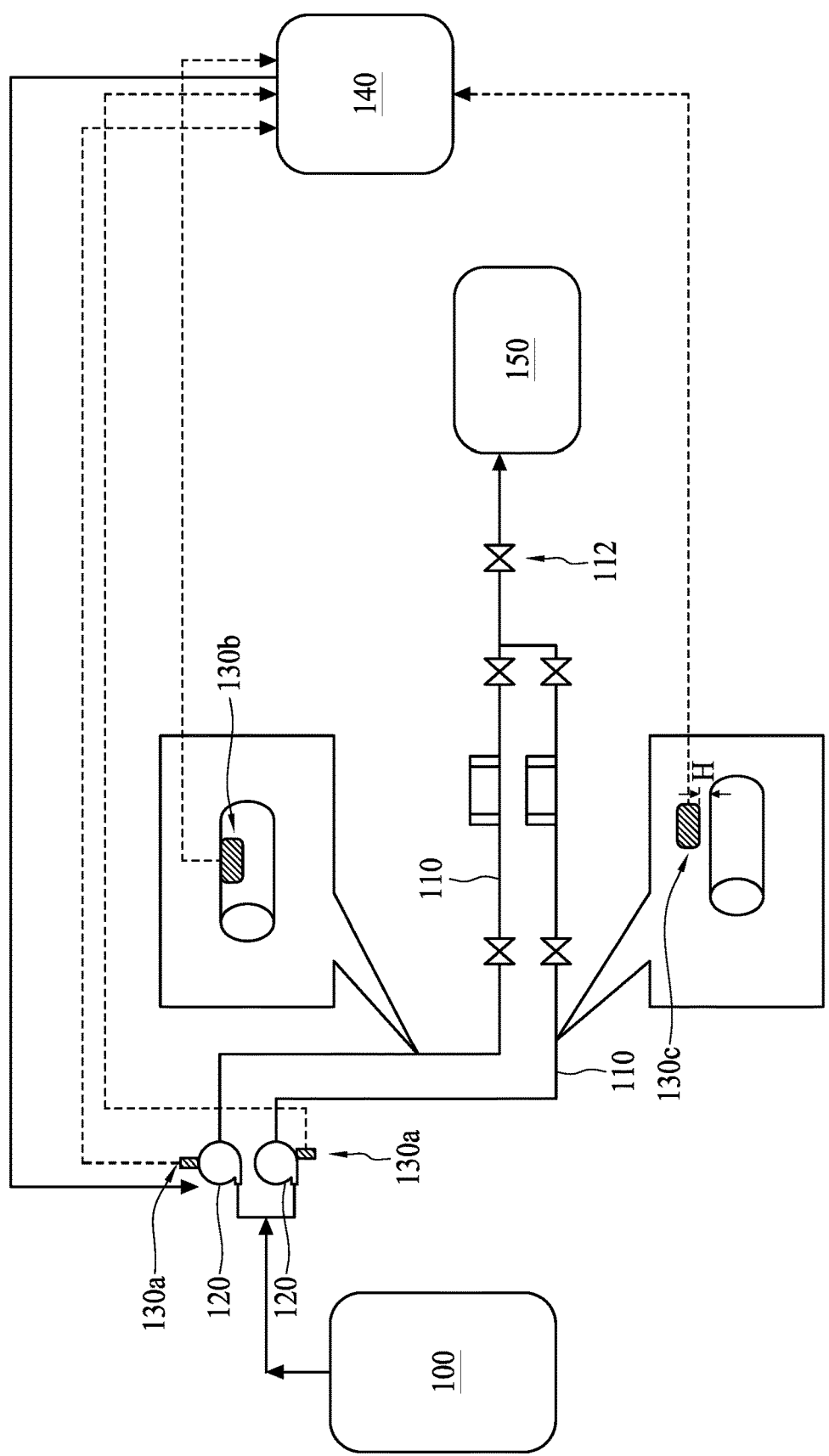
FIG. 3 is a schematic drawing of a system for supplying a chemical solution according to aspects of one or more embodiments of the present disclosure.

FIGS. 1 to 3 are schematic drawings of a system for supplying a chemical solution 10a, 10b, 10c according to aspects of one or more embodiments of the present disclosure. It should be understood that same elements in FIGS. 1 to 3 are depicted by same numerals, and repetitive details may be omitted in the interest of brevity. The system for supplying the chemical solution 10a, 10b, 10c includes a chemical storage tank 100. The chemical storage tank 100 is configured to store one or more types of chemical solutions. In other embodiments, the system 10a, 10b, 10c may include variable-volume chemical storage tanks 100 (not shown). In some embodiments, the system 10a, 10b, 10c may further include a mixer configured to mix the chemical solutions stored in the chemical storage tank 100.

The system 10a, 10b, 10c includes at least a pipeline 110 connected to the chemical storage tank 100 and a pump 120 connected to the pipeline 110. Depending on the chemical solutions to be supplied by the system 10a, 10b, 10c, the chemical solutions may be mixed by the aforementioned mixer before being supplied to the pipeline 110. In some alternative embodiments, the system 10a, 10b, 10c can store the chemical solutions and supply the chemical solutions to the pipeline 110 without mixing.

In some embodiments, the pipeline 110 includes an insulating material. In some embodiments, the pipeline 110 is made of the insulating material. In some embodiments, the insulating material is selected from the group consisting essentially of perfluoroalkoxy (PFA), polytetrafluoroethylene (PTFE), non-explosive polyfluoroalkoxy (NE-PFA), and anti-static polyfluoroalkoxy (AS-PFA). In other embodiments, at least an inner surface of the pipeline 110 includes the insulating material. For example, a liner can be formed to entirely cover the inner surface of the pipeline 110. In some embodiments, the liner can include, for example but not limited thereto, PTFE or high density polyethylene (HDPE).

In some embodiments, the system 10a, 10b, 10c may include other components. For example, the components can include a filter (not shown) and a valve 112. The valve 112 helps to control the flow of the chemical solutions. For example, the valve 112 helps to prevent backflow. In some embodiments, the valve 112 can be a suck-back valve. In some embodiments, the valve 112 can be a check valve. In some embodiments, the valve 112 includes a mechanism for releasing gas trapped in the pipeline 110. In some embodiments, the valve 112 is an electronically controlled valve. In some embodiments, the valve 112 is electrically connected to a control unit 140 and is operated by the control unit 140.

Figure 4:
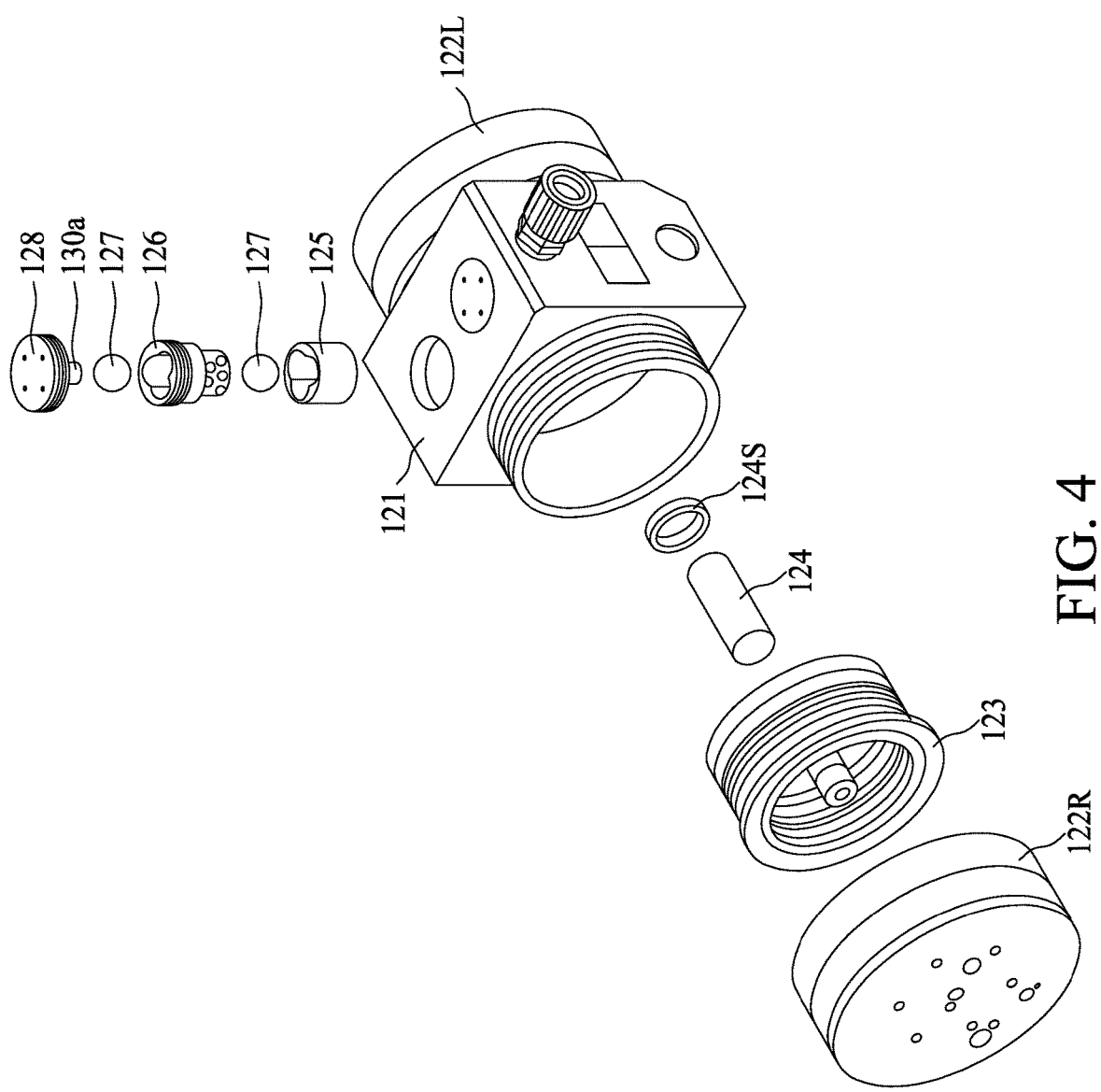
FIG. 4 is a schematic drawing of a portion of a pump according to aspects of one or more embodiments of the present disclosure.

Please refer to FIG. 4, which is a schematic drawing of a portion of the pump 120 according to aspects of one or more embodiments of the present disclosure. The pump 120 is connected to the pipeline 110 and is configured to pump the chemical solution from the chemical storage tank 100 into the pipeline 110. In some embodiments, the pump 120 includes a pump body 121, a right head 112R, a left head 122L, an assembly bellow 123, a shaft 124, a shaft seal 124S, a check seat 125, a check cage 126, a check ball 127 and a check plug 128. In some embodiments, the pump 120 can include polytetrafluoroethylene (PTFE), which reduces extractable metal ionic contamination. The check ball 127 can be a moving element in the pump 120. It should be understood that triboelectricity is generated by a moving element, and thus the check ball 127 is likely to trigger the electrostatic discharge.

The system 10a, 10b, 10c further includes an electrostatic probe 130a coupled to the pump 120 and configured to measure an electrostatic voltage of the pump 120. In some embodiments, the electrostatic probe 130a is adopted in proximity to the moving element, such as the check ball 127. As mentioned above, because the check ball 127, which is the moving element, is most likely to trigger the electrostatic discharge, the electrostatic probe 130a can be coupled to the pump 120 in proximity to the check ball 127, as shown in FIG. 4. In some embodiments, because the electrostatic probe 130a is in proximity to the check ball 127, a highest electrostatic voltage can be accurately and promptly measured.

Figure 5:
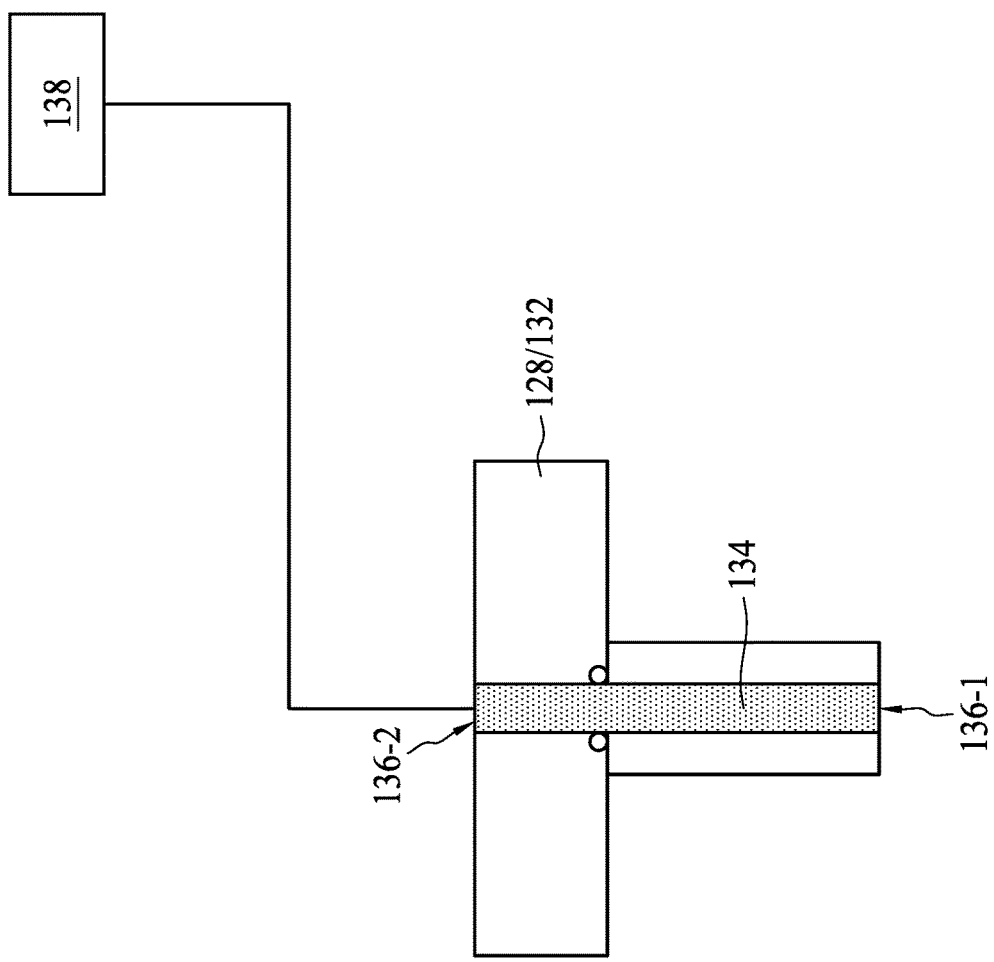
FIG. 5 is a schematic drawing of an electrostatic probe according to aspects of one or more embodiments of the present disclosure.

Please refer to FIG. 5, which is a schematic drawing of an electrostatic probe according to aspects of one or more embodiments of the present disclosure. In some embodiments, as shown in FIGS. 4 and 5, the electrostatic probe 130a can be integrated with the check plug 128. In such embodiments, the electrostatic probe 130a can be enclosed by the check plug 128. In some embodiments, the electrostatic probe 130a can include an insulative sealing portion 132 and a conductive portion 134 enclosed by the insulative sealing portion 132. The insulative sealing portion 132 can include insulating material such as PFA, PTFE, NE-PFA, and AS-PFA, but the disclosure is not limited thereto. A width of the conductive portion 134 is less than a width of the check plug 128 or less than a width of the insulative sealing portion 132, such that sidewalls of the conductive portion 134 can be protected by the check plug 128 or protected by the insulative sealing portion 132. A length of the insulative sealing portion 132 and a length of the conductive portion 134 can have a ratio, and the ratio can be adjusted according to a liquid flow rate of the chemical solution in the pump 120.

Further, an end 136-1 of the conductive portion 134 of the electrostatic probe 130a can be exposed through the check plug 128 or exposed through the insulative sealing portion 132 in order to contact the chemical solution in the pump 120 and to measure the electrostatic voltage of the pump 120. Another end 136-2 of the conductive portion 134 of the electrostatic probe 130a can be electrically connected to a pre-amplifier 138. The pre-amplifier 138 is an electronic amplifier that converts a weak electrical signal into an output signal that is strong enough for further processing. In some embodiments, an explosion-proof connector and an explosion-proof cable can be used to electrically connect the end 136-2 of the conductive portion 134 of the electrostatic probe 130a to the amplifier 138, but the disclosure is not limited thereto.

The system 10a, 10b, 10c further includes the control unit 140 coupled to the electrostatic probe 130a, wherein the control unit is configured to obtain an electrostatic voltage from the electrostatic probe 130a. In some embodiments, the control unit 140 is electrically connected to the pump 120 and configured to adjust at least a parameter of the pump 120. In some embodiments, the control unit 140 receives signals (i.e., signals indicating the electrostatic voltage of the pump) from the electrostatic probe 130a and sends signals to adjust the parameter of the pump 120 according to the obtained electrostatic voltage. The parameters of the pump 120 can include a fluid horsepower, a pump operation speed and a frequency. In some embodiments, when the electrostatic voltage of the pump 120 is greater than, for example but not limited to, approximately 5 KV, the control unit 140 may send signals to reduce the fluid horsepower, the pump operation speed and/or the frequency. In some embodiments, when the electrostatic voltage of the pump 120 is greater than, for example but not limited to, approximately 5 KV-10 KV, the control unit 140 may send signals to reduce the fluid horsepower, the pump operation speed and/or the frequency. In some comparative approaches, if the control unit 140 sends signals when the electrostatic voltage of the pump 120 is less than approximately 5 KV, the system 10a is so sensitive that false alarm may be triggered. In other comparative approaches, if the control unit 140 sends signals when the electrostatic voltage of the pump 120 is greater than approximately 10 KV, the risk of static electricity may not be detected in time.

Referring to FIG. 2, in some embodiments, the system 10b includes an electrostatic probe 130a and an electrostatic probe 130b. Both of the electrostatic probe 130a and the electrostatic probe 130b are coupled to the control unit 140. The electrostatic probe 130a is coupled to the pump 120 while the electrostatic probe 130b is coupled to an inside of the pipeline 110. As mentioned above, the electrostatic probe 130a is configured to measure an electrostatic voltage of the pump 120 and provide such measurement to the control unit 140. The electrostatic probe 130b is configured to measure an electrostatic voltage of the inside of the pipeline 110 and provide such measurement to the control unit 140. In some embodiments, the electrostatic probe 130b is attached to an inner surface of the pipeline 110 and is used to measure and monitor the electrostatic voltage of the inside of the pipeline 110 as the chemical solution passes through. The electrostatic probe 130b can be attached to the inner surface of the pipeline 110 by an adhesive layer (not shown), but the disclosure is not limited thereto. In some embodiments, a pre-amplifier (not shown) can be disposed between and electrically connected to the electrostatic probe 130b and the control unit 140, such that a weak electrical signal can be amplified into an output signal that is strong enough for further processing. In some embodiments, the electrostatic probe 130b can include the insulating sealing portion 132 and the conductive portion 134 as shown in FIG. 5. Therefore those details are omitted herein for brevity.

Referring to FIG. 3, in some embodiments, the system 10c includes an electrostatic probe 130a, an electrostatic probe 130b and an electrostatic probe 130c. Each of the electrostatic probe 130a, the electrostatic probe 130b and the electrostatic probe 130c is coupled to the control unit 140. The electrostatic probe 130a is coupled to the pump 120, the electrostatic probe 130b is coupled to an inside of the pipeline 110, and the electrostatic probe 130c is coupled to an outside of the pipeline 110. The electrostatic probe 130a is configured to measure an electrostatic voltage of the pump 120 and provide such measurement to the control unit 140, the electrostatic probe 130b is configured to measure an electrostatic voltage of the inside of the pipeline 110 and provide such measurement to the control unit 140, and the electrostatic probe 130c is configured to measure an electrostatic voltage of the outside of the pipeline 110 and provide such measurement to the control unit 140. In some embodiments, the electrostatic probe 130c is disposed over an outer surface of the pipeline 110 and is used to measure and monitor the electrostatic voltage of the outside of the pipeline 110. As mentioned above, the electrostatic probe 130b can be attached to the inner surface of the pipeline 110 by an adhesive layer (not shown), but the disclosure is not limited thereto. A distance H can be defined between the electrostatic probe 130c and the outer surface of the pipeline 110. In some embodiments, the distance H can be between approximately 5 mm and approximately 10 mm. In some comparative approaches, it is found that when the distance H is less than approximately 5 mm or greater than approximately 10 mm, the measurement is adversely impacted. In some embodiments, a pre-amplifier (not shown) can be disposed between and electrically connected to the electrostatic probe 130c and the control unit 140, such that a weak electrical signal can be amplified into an output signal that is strong enough for further processing.

Figure 6:
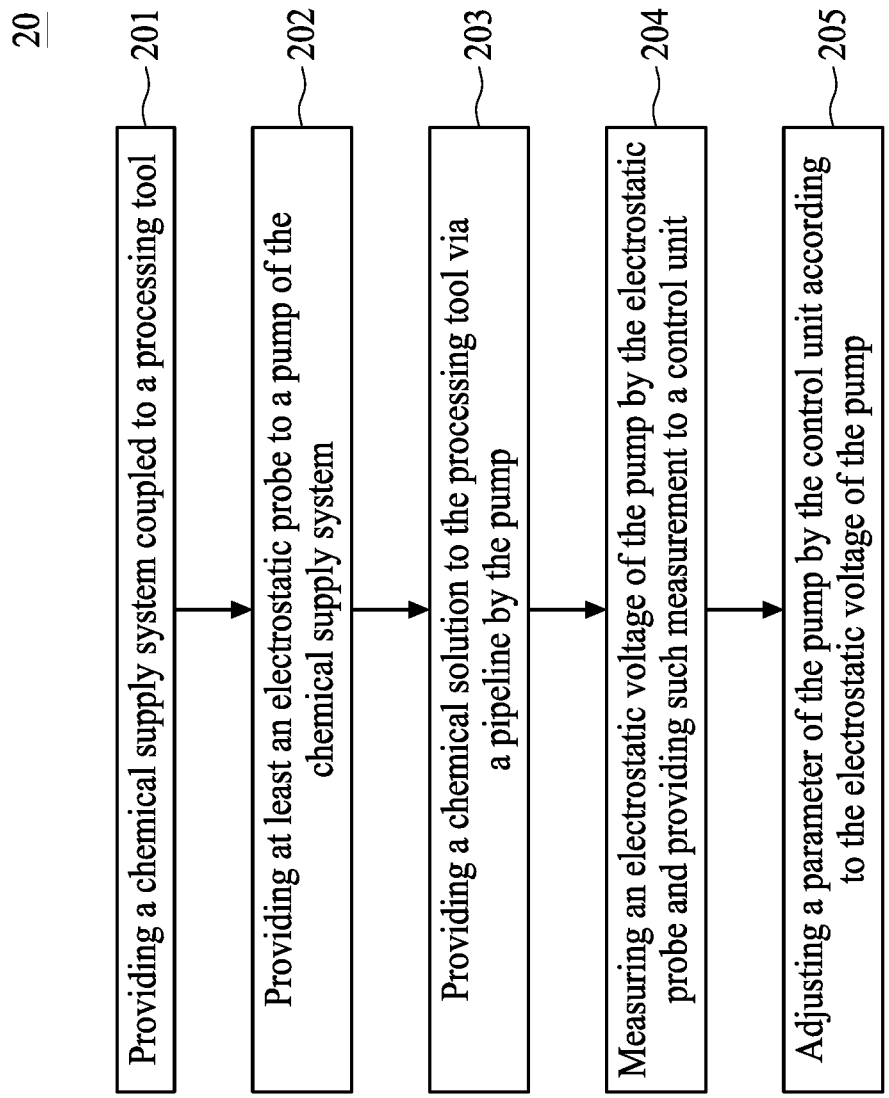
FIG. 6 is a flowchart representing a method for supplying a chemical solution according to aspects of one or more embodiments of the present disclosure.

Please refer to FIG. 6, which is a flowchart representing a method for supplying a chemical solution 20 according to aspects of one or more embodiments of the present disclosure. The method for supplying the chemical solution 20 includes a number of operations (201, 202, 203, 204, 205 and 206). The method for supplying the chemical solution 20 will be further described according to one or more embodiments. It should be noted that the operations of the method for supplying the chemical solution 20 may be rearranged or otherwise modified within the scope of the various aspects. It should further be noted that additional processes may be provided before, during, and after the method for supplying the chemical solution 20, and that some other processes may be only briefly described herein. Thus other implementations are possible within the scope of the various aspects described herein.

In some embodiments, the method for supplying the chemical solution 20 can begin with operation 201 in which a chemical supply system coupled to a processing tool is provided. The method 20 proceeds with operation 202 in which at least an electrostatic probe is provided to a pump of the chemical supply system. The method 20 proceeds with operation 203 in which a chemical solution is provided to the processing tool via a pipeline by the pump. The method 20 proceeds with operation 204 in which an electrostatic voltage of the pump is measured by the electrostatic probe and such measurement is provide to a control unit. The method 20 continues with operation 205 in which a parameter of the pump us adjusted by the control unit according to the electrostatic voltage of the pump.

In some embodiments, at operation 201, a chemical supply system is provided and coupled to a processing tool. Referring to FIGS. 1 to 3, the chemical supply system can include the system for supplying the chemical solution 10a, 10b, 10c. In some embodiments, the system for supplying the chemical solution 10a, 10b, 10c is coupled to the processing tool 150, as shown in FIGS. 1 to 3. In some embodiments, the processing tool 150 includes an etcher, a wet cleaner, and a photolithography system. In some embodiments, a dispensing device for dispensing chemical solutions onto a surface of a wafer can be disposed between and coupled to the system for supplying the chemical solution 10a, 10b, 10c and the processing tool 150. In some embodiments, the dispensing device can be used in the photolithography system. In such embodiments, the chemical solution is suitable for spin coating on the surface of the wafer. For example, the chemical solutions can include a bottom anti-reflective coating (BARC) solution or a primer solution such as a primer that improves adhesion between the surface of the wafer and a photoresist. In some embodiments, the chemical solutions can include photoresist. In some embodiments, the chemical solutions can include a photoresist developer such as an n-butyl acetate (nBA) (conductivity: 4300 ps/m). In other embodiments, the chemical solution includes organic solutions with low conductivity commonly used in semiconductor processes. For example, the chemical solutions can include propylene glycol methyl ether acetate (PGMEA) (conductivity: $3*10^4$ ps/m), methylpyrrolidone (nMP) (conductivity: $2*10^6$ ps/m), etc.

At operation 202, at least an electrostatic probe is provided and coupled to the system for supplying the chemical solution 10a, 10b, 10c. In some embodiments, an electrostatic probe 130a is coupled to the pump 120 of the system 10a, as shown in FIG. 1. In some embodiments, an electrostatic probe 130a is coupled to the pump 120 and an electrostatic probe 130b is coupled to an inside of the pipeline 110 of the system 10b, as shown in FIG. 2. In other embodiments, an electrostatic probe 130a is coupled to the pump 120, an electrostatic probe 130b is coupled to an inside of the pipeline 110, and an electrostatic probe 130c is coupled to an outside of the pipeline 110 of the system 10c, as shown in FIG. 3. As shown in FIG. 4, in some embodiments, the electrostatic probe 130a is coupled or adopted in proximity to a moving element such as a check ball 127 of the pump 120. In some embodiments, the electrostatic probe 130a can be integrated with a check plug 128 which is in proximity to the check ball 127 of the pump 120.

At operation 203, the chemical solution is provided to the processing tool 150 via the pipeline 110 by the pump 120. In some embodiments, the chemical solution is pumped from the chemical storage tank 100 into the pipeline 110 by the pump 120, as shown in FIGS. 1 to 3.

At operation 204, an electrostatic voltage of the pump 120 is measured by the electrostatic probe 130a, and such measurement is provided to the control unit 140 during the pumping of the chemical solution. As mentioned above, because the check ball 127 is most likely to trigger the electrostatic discharge, the electrostatic probe 130a, which is in proximity to the check ball 127, can measure a highest electrostatic voltage accurately and promptly. In such embodiments, the measurement of the electrostatic voltage of the pump 120 can be concurrently provided to the control unit 140, as shown in FIG. 1.

In some embodiments, at operation 204, the electrostatic probe 130b is also used to measure an electrostatic voltage of the inside of the pipeline 110. Further, the measurement of the electrostatic voltage of the inside of the pipeline 110 is provided to the control unit 140 by the electrostatic probe 130b during the pumping of the chemical solution. In such embodiments, the measurement of the electrostatic voltage of the pump 120 and the measurement of the electrostatic voltage of the inside of the pipeline 110 can be concurrently provided to the control unit 140, as shown in FIG. 2.

In some embodiments, weighting values can be provided after receiving the measurement of the electrostatic voltage of the pump 120 and receiving the measurement of the electrostatic voltage of the inside of the pipeline 110 in the control unit 140. In some embodiments, the weighting values may amplify the effects to the pump 120 or the inside of the pipeline 110, depending on the process monitoring requirement. In other embodiments, the weighting values may reduce the effects or noise to the pump 120 or the inside of the pipeline 110, depending on the process monitoring requirement.

In some embodiments, the electrostatic probe 130c is also used to measure an electrostatic voltage of the outside of the pipeline 110 at operation 204. Further, the measurement of the electrostatic voltage of the outside of the pipeline 110 is provided to the control unit 140 by the electrostatic probe 130c during the pumping of the chemical solution. In such embodiments, the measurement of the electrostatic voltage of the pump 120, the measurement of the electrostatic voltage of the inside of the pipeline 110, and the measurement of electrostatic voltage of the outside of the pipeline 110 are concurrently provided to the control unit 140, as shown in FIG. 3.

In some embodiments, weighting values can be provided after receiving the measurement of the electrostatic voltage of the pump 120, the electrostatic voltage of the measurement of the inside of the pipeline 110 and the measurement of the electrostatic voltage of the outside of the pipeline 110 in the control unit 140. In some embodiments, the weighting values may amplify the effects to the pump 120, the inside of the pipeline 110 or the outside of the pipeline 140, depending on the process monitoring requirement. In other embodiments, the weighting values may reduce the effects or noise to the pump 120, the inside of the pipeline 110 or the outside of the pipeline 110, depending on the process monitoring requirement.

At operation 205, a parameter of the pump 120 is adjusted by the control unit 140. In some embodiments, as shown in FIG. 1, the parameter of the pump 120 is adjusted by the control unit 140 according to the measurement of the electrostatic voltage of the pump 120 obtained from the electrostatic probe 130a of the system 10a. In some embodiments, the parameters of the pump 120 include a fluid horsepower, a pump operation speed and a frequency. For example, when the electrostatic voltage of the pump 120 is greater than approximately 5 KV, the control unit 140 may send signals to reduce the fluid horsepower, the pump operation speed and/or the frequency of the pump 120. For example, when the electrostatic voltage of the pump 120 is greater than approximately 5 KV-10 KV, the control unit 140 may send signals to reduce the fluid horsepower, the pump operation speed and/or the frequency of the pump 120.

In some embodiments, the parameters of the pump 120 can be adjusted or tuned by the control unit 140 according to the measurement of the electrostatic voltage of the pump 120 obtained from the electrostatic probe 130a and the measurement of the electrostatic voltage of the inside of the pipeline 110 obtained from the electrostatic probe 130b of the system 10b at operation 205, as shown in FIG. 2.

In some embodiments, at operation 205, as shown in in FIG. 3, the parameters of the pump 120 can be adjusted or tuned by the control unit 140 according to the measurement of the electrostatic voltage of the pump 120 obtained from the electrostatic probe 130a, measurement of the electrostatic voltage of the inside of the pipeline 110 obtained from the electrostatic probe 130b and the measurement of the electrostatic voltage of the outside of the pipeline 110 obtained from the electrostatic probe 130c of the system 10c.

Figure 7:
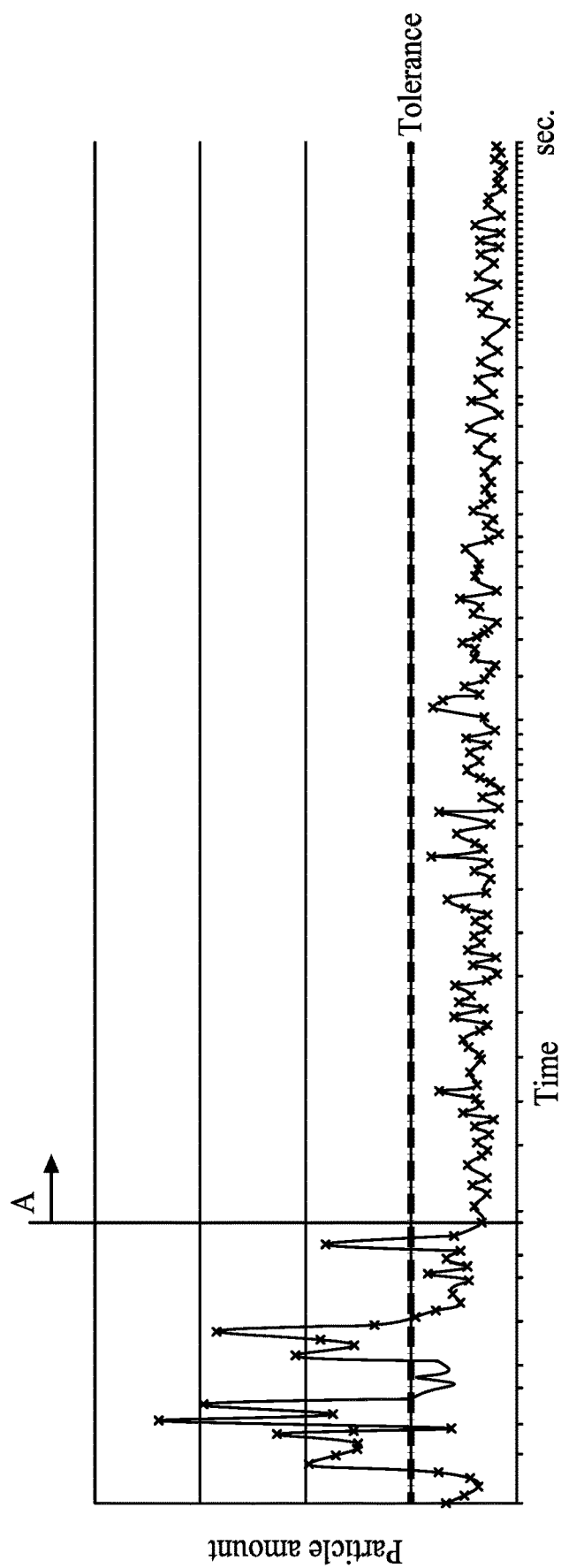
FIG. 7 is a graph illustrating a relation between particles and time.

In some embodiments, by reducing the parameters of the pump 120, the static electricity generated during the pumping of the chemical solution can be reduced. Because the static electricity in the pump is reduced, particle issue can be mitigated. Please refer to FIG. 7, which is a graph illustrating a relation between particles and time. In some embodiments, the electrostatic discharge may create particles and the particles may fall on the wafer to be processed and thus the particle contamination is found. In some embodiments, an upper limit for particle amount found on a wafer can be referred to as a tolerance. When the particle amount found on the wafer is greater than the tolerance, particle contamination is determined to occur. As shown in FIG. 7, before time A, the wafer may suffer from the particle contamination. Because the particle amount is correlated to the static electricity, when the static electricity is reduced, the particle amount is inherently reduced. To mitigate such particle contamination issue, when the control unit 140 receives measurement of the electrostatic voltage of the pump 120 from the electrostatic probe 130a, the control unit 140 may adjust or tune the parameter of the pump 120, such that the static electricity in the pump 120 can be reduced. As shown in FIG. 7, in some embodiments, the control unit 140 may receive the measurement of the electrostatic voltage of the pump 120 from the electrostatic probe 130a and reduce the fluid horsepower, the pump operation speed and/or the frequency of the pump 120 at time A. Consequently, the static electricity in the pump 120 is reduced, and particle amount is reduced after time A, as shown in FIG. 7.

Further, because the electrostatic probe 130a is coupled to the pump 120, the static electricity generated in the pump 120 can be continuously monitored and thus the adjustment of the pump 120 can be performed promptly.

It is known that a spark from the outside of the pipeline 110 may ignite a flammable liquid in the solvent-laden environment and cause a fire or explosion in the semiconductor fabrication facility. It is also known that there are two causes of the fire or explosion: a flammable chemical leak caused by the electrostatic discharge through the wall of the pipeline 110 and an electrostatic discharge from the outside of the pipeline 110.

In some embodiments, the electrostatic probe 130b coupled to the inside of the pipeline 110 monitors the electrostatic voltage in the pipeline 110. Thus, the particle issue can be further mitigated. In such embodiments, a leak path in the pipeline 110 can be mitigated. It is known that the static electricity generated within the pipeline 110 may cause the leak path. Therefore, because the electrostatic probe 130b measures the electrostatic voltage of the inside of the pipeline 110 and provides such measurement to the control unit 140, the condition of the inside of the pipeline 110 can be monitored, and thus the leak path issue can be mitigated. Further, the risk of the fire due to the leak path caused by the electrostatic discharge through the wall of the pipeline 110 can be reduced.

The electrostatic probe 130c coupled to the outside of the pipeline 110 monitors the electrostatic voltage of the outer surface of the pipeline 110. In such embodiments, when the control unit 140 receives the measurement of the electrostatic voltage of the outside of the pipeline 110 from the electrostatic probe 130c, the control unit 140 may adjust or tune the parameter of the pump 120 such that the static electricity in the pump 120 can be reduced. In other embodiments, the control unit 140 may send an alarm. Because the electrostatic probe 130c measures the electrostatic voltage of the outside of the pipeline 110 and provides the measurement of the electrostatic voltage to the control unit 140, the condition of the outside of the pipeline 110 can be monitored. Further, the risk of the fire due to the electrostatic discharge from the outside of the pipeline 110 can be reduced.

The present disclosure therefore provides a system and a method for supplying a chemical solution. The system and the method for supplying the chemical solution are used to measure and control static electricity. In some embodiments, the system includes electrostatic probes coupled to or adopted on pumps and pipelines to provide on line measurement and monitoring. In some embodiments, the electrostatic probes adopted on the pumps and the pipelines provide continuous static electricity measurement, and therefore external environmental effects or human error can be mitigated. In some embodiments, the method further adjusts or tunes parameters of the system for supplying the chemical solution to reduce static electricity generation according to the measurement obtained from the electrostatic probes. Accordingly, the adjustment can be performed promptly and thus particle contamination can be mitigated.

In some embodiments, a system for supplying a chemical solution is provided. The system includes a chemical storage tank, a pipeline, a pump, a first electrostatic probe, and a control unit. The pipeline is connected to the chemical storage tank. The pump is connected to the pipeline and configured to pump a chemical solution from the chemical storage tank into the pipeline. The first electrostatic probe is coupled to the pump and configured to measure an electrostatic voltage of the pump. The control unit is coupled to the first electrostatic probe and configured to obtain a measurement of the electrostatic voltage from the first electrostatic probe.

In some embodiments, a system for supplying a chemical solution is provided. The system includes a chemical storage tank, a pipeline, a pump, a first electrostatic probe, a second electrostatic probe, and a control unit. The pipeline is connected to the chemical storage tank. The pump is connected to the pipeline and configured to pump a chemical solution from the chemical storage tank into the pipeline. The first electrostatic probe is coupled to the pump and configured to measure a first electrostatic voltage of the pump. The second electrostatic probe is coupled to the control unit and an inside of the pipeline, and configured to provide a measurement of a second electrostatic voltage of the inside of the pipeline to the control unit. The control unit is coupled to the first electrostatic probe and the second electrostatic probe, and configured to obtain a measurement of the first electrostatic voltage and the second electrostatic voltage.

In some embodiments, a system for supplying a chemical solution is provided. The system includes a chemical storage tank, a pipeline, a pump, a first electrostatic probe, a second electrostatic probe, a third electrostatic probe, and a control unit. The pipeline is connected to the chemical storage tank. The pump is connected to the pipeline and configured to pump a chemical solution from the chemical storage tank into the pipeline. The first electrostatic probe is coupled to the pump and configured to measure a first electrostatic voltage of the pump. The second electrostatic probe is coupled to the control unit and an inside of the pipeline, and configured to provide a measurement of a second electrostatic voltage of the inside of the pipeline to the control unit. The third electrostatic probe is coupled to the control unit and an outside of the pipeline, and configured to provide a measurement of a third electrostatic voltage of the outside of the pipeline to the control unit. The control unit is coupled to the first, second and third electrostatic probes, and configured to obtain a measurement of the first, second and third electrostatic voltages to adjust at least a parameter of the pump.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for supplying chemical solutions comprising:
   a chemical storage tank;
   a pipeline connected to the chemical storage tank;
   a pump connected to the pipeline and configured to pump a chemical solution from the chemical storage tank into the pipeline, wherein the pump comprises at least one moving element, and the at least one moving element comprises a check ball;
   a first electrostatic probe coupled to the pump and configured to measure an electrostatic voltage of the pump, wherein the first electrostatic probe is proximate to the at least one moving element; and
   a control unit coupled to the first electrostatic probe and configured to obtain the measurement of the electrostatic voltage from the first electrostatic probe.

2. The system of claim 1, further comprising a second electrostatic probe coupled to the control unit and an inside of the pipeline, and configured to provide a measurement of an electrostatic voltage of the inside of the pipeline to the control unit.

3. The system of claim 1, further comprising a second electrostatic probe coupled to the control unit and an outside of the pipeline, and configured to provide a measurement of an electrostatic voltage of the outside of the pipeline to the control unit.

4. The system of claim 3, wherein a distance between the second electrostatic probe and an outer surface of the pipeline is between approximately 5 mm and 10 mm.

5. The system of claim 1, wherein the control unit is configured to adjust at least a parameter of the pump.

6. The system of claim 5, wherein the parameter of the pump comprises one of a fluid horsepower, a pump operation speed and a frequency.

7. The system of claim 1, wherein the pipeline comprises an insulating material.

8. The system of claim 7, wherein the insulating material is selected from a group consisting essentially of perfluoroalkoxy (PFA), polytetrafluoroethylene (PTFE), non-explosive polyfluoroalkoxy (NE-PFA), and anti-static polyfluoroalkoxy (AS-PFA).

9. A system for supplying chemical solutions, comprising:
   a chemical storage tank;
   a pipeline connected to the chemical storage tank;
   a pump connected to the pipeline and configured to pump a chemical solution from the chemical storage tank into the pipeline, wherein the pump comprises at least one moving element, and the at least one moving element comprises a check ball;
   a first electrostatic probe coupled to the pump and configured to measure a first electrostatic voltage of the pump, wherein the first electrostatic probe is proximate to the at least one moving element;
   a second electrostatic probe coupled to an inside of the pipeline, and configured to provide a measurement of a second electrostatic voltage of the inside of the pipeline; and
   a control unit coupled to the first electrostatic probe and the second electrostatic probe, and configured to obtain the measurement of the first electrostatic voltage and the second electrostatic voltage.

10. The system of claim 9, further comprising a third electrostatic probe coupled to the control unit and an outside of the pipeline, and configured to provide a measurement of a third electrostatic voltage of the outside of the pipeline to the control unit.

11. The system of claim 10, wherein a distance between the third electrostatic probe and an outer surface of the pipeline is between approximately 5 mm and 10 mm.

12. The system of claim 9, wherein the control unit is configured to adjust at least a parameter of the pump.

13. The system of claim 12, wherein the parameter of the pump comprises one of a fluid horsepower, a pump operation speed and a frequency.

14. The system of claim 9, wherein the pipeline comprises an insulating material.

15. The system of claim 14, wherein the insulating material is selected from a group consisting essentially of perfluoroalkoxy (PFA), polytetrafluoroethylene (PTFE), non-explosive polyfluoroalkoxy (NE-PFA), and anti-static polyfluoroalkoxy (AS-PFA).

16. A system for supplying chemical solutions, comprising:
   a chemical storage tank;
   a pipeline connected to the chemical storage tank;
   a pump connected to the pipeline and configured to pump a chemical solution from the chemical storage tank into the pipeline, wherein the pump comprises at least one moving element, and the at least one moving element comprises a check ball;
   a first electrostatic probe coupled to the pump proximate to the at least one moving element and configured to measure a first electrostatic voltage of the pump;
   a second electrostatic probe coupled to an inside of the pipeline, and configured to provide a measurement of a second electrostatic voltage of the inside of the pipeline;
   a third electrostatic probe coupled to an outside of the pipeline, and configured to provide a measurement of a third electrostatic voltage of the outside of the pipeline; and
   a control unit coupled to the first electrostatic probe, the second electrostatic probe and the third electrostatic probe, and configured to obtain the measurement of the first, second and third electrostatic voltages to adjust at least a parameter of the pump.

17. The system of claim 16, wherein the parameter of the pump comprises one of a fluid horsepower, a pump operation speed and a frequency.

18. The system of claim 16, wherein the pipeline comprises an insulating material.

19. The system of claim 16, wherein a distance between the third electrostatic probe and an outer surface of the pipeline is between approximately 5 mm and 10 mm.

* * * * *